United States Patent [19]

Knauer

[11] 4,350,902

[45] Sep. 21, 1982

[54] INPUT STAGE FOR A MONOLITHICALLY INTEGRATED CHARGE TRANSFER DEVICE WHICH GENERATES TWO COMPLEMENTARY CHARGE PACKETS

[75] Inventor: Karl Knauer, Kirchseeon, Fed. Rep. of Germany

[73] Assignee: Siemens Aktiengesellschaft, Berlin & Munich, Fed. Rep. of Germany

[21] Appl. No.: 165,249

[22] Filed: Jul. 2, 1980

[30] Foreign Application Priority Data

Sep. 11, 1979 [DE] Fed. Rep. of Germany ....... 2936682

[51] Int. Cl.³ ...................... G11C 19/28; H01L 29/78
[52] U.S. Cl. ................................ 307/221 D; 357/24
[58] Field of Search .................. 307/221 D; 357/24 R

[56] References Cited

U.S. PATENT DOCUMENTS 4,099,197   7/1978   Ibrahim et al. .................. 357/24 R
4,210,825   7/1980   Crochiere et al. ............. 307/221 D

OTHER PUBLICATIONS

Sequin et al., "A Symmetrically Balanced Linear Differential Charge-Splitting Input for Charge-Coupled Devices", IEEE Trans. Electron Devices, vol. Ed-24(6177), pp. 746-750.

Sequin et al., *Charge Transfer Devices*, Academic Press, New York, 1975, pp. 1-18, 52-56.

Kosonocky, "Charge-Coupled Devices", Wescon Technical Papers, (9/74), vol. 18, Sec. 2/1, pp. 1-20.

*Primary Examiner*—Gene M. Munson
*Attorney, Agent, or Firm*—Hill, Van Santen, Steadman, Chiara & Simpson

[57] ABSTRACT

An input stage for a monolithically integrated charge transfer device of the type which generates two complementary charge packets from one input signal, said input stage having at least two transfer gates disposed between a source region in a semiconductor body and an input gate which is charged with the input signal. The two transfer gates in the input stage are connected to clock pulse voltages which operate at one half the clock frequency of the transfer stages covering the transfer channel of the charge transfer device. A particularly low-noise encoding of the input signal into the two complementary charge packets results thereby and the structure is particularly suitable for analog signal processing.

4 Claims, 7 Drawing Figures

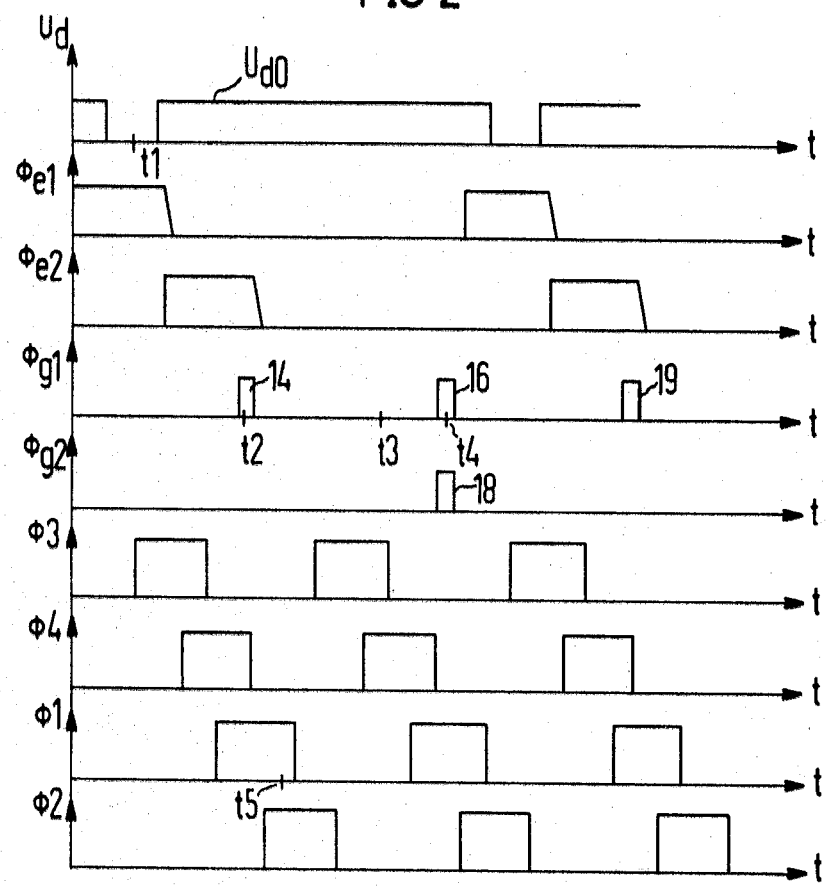

INPUT STAGE FOR A MONOLITHICALLY INTEGRATED CHARGE TRANSFER DEVICE WHICH GENERATES TWO COMPLEMENTARY CHARGE PACKETS

BACKGROUND OF THE INVENTION

1. Field of the Invention

The present invention relates to input stages for monolithically integrated charge transfer devices, and in particular input stages for such devices which generate to complementary charge packets from a single input signal.

2. Description of the Prior Art

An input stage for a monolithically integrated charge transfer device which generates a pair of complementary charge packets from a single input signal is known, for example, from the article "A Symmetrical Balanced Linear Differential Charge-Splitting Input for Charge-Coupled Devices", IEEE Transactions on Electron Devices, Vol. ED-24, No. 6, June, 1977 at pages 746 through 750. As described therein, the input stage has two adjacent input gate electrodes which are connected to voltages of different magnitudes, which magnitudes differ from one another by the amount of an input signal. A strip-like dividing gate is disposed between the input gate electrodes. Charge packets of constant size derived from a source region in a semiconductor body are shifted by transfer gate electrodes into the semiconductor zone beneath the two input gate electrodes, at which point the charge packets are divided into two complimentary charge packets as a result of the potential wells formed beneath the input gate electrodes according to the different voltages supplied thereto. After this division, a voltage is supplied to the dividing gate between the input gate electrodes such that a potential barrier arises between the electrodes. The complimentary charge packets are then shifted electrode-by-electrode in two separate transfer channels of the charge transfer device in the direction toward the output stage.

The disadvantage of the above-described structure is the relatively large area of semiconductor surface which is required by the two input gate electrodes and the two transfer channels. Moreover, different electron trap concentrations at the semiconductor boundary surface may exist in the two transfer channels, so that the two complimentary charge packets are subjected to different thermal influences during transfer thereof and are thereby distorted to different degrees in the separate channels.

The theory and operation of basic charge transfer devices of the type which may be utilized in the present invention in combination with the improvements disclosed herein are known, for example, from the text "Charge Transfer Devices", Sequin and Tompsett, Academic Press, New York, 1975 at pages 1–18 and 52–56. Output stages for such devices of the type known as "floating diffusion outputs" and "floating gate outputs" which may be utilized in the present invention are described in detail in the article "Charge Coupled Devices-An Overview", W. F. Kosonocki, WESCON Technical Papers, 1974, Vol. 18, at page 7 of section 2/1.

SUMMARY OF THE INVENTION

It is an object of the present invention to provide an input stage for a charge transfer device for generating two complimentary charge packets which utilizes a relatively small semiconductor surface area and subjects the charge packets generated thereby to a minimum of differing thermal influences.

The above object is inventively achieved by providing an input stage which can be constructed on a significantly smaller semiconductor surface than known structures and which subjects the charge packets to the same basic thermal influences by shifting the complimentary charge packets in the same transfer channel.

The device consists of a charge transfer device monolithically integrated on a semiconductor substrate of one conductivity type which is covered with a thin insulating layer. The inventive input stage for this device has an opposite conductivity type (oppositely doped) region in the substrate, a first gate covering the zone of the semiconductor substrate next to the oppositely doped region, an input gate connected to a source of input signals, two transfer gate electrodes disposed between the first gate and the input gate, and a second gate disposed after the input gate in the direction of charge movement.

A clock pulse voltage is supplied to the oppositely doped region and a constant voltage is supplied to the first gate in the input stage. The transfer gate electrodes in the input stage are connected to separate clock pulse voltages which are phase-displaced with respect to each other. The second gate is connected to a clock pulse voltage which operates at the same frequency as the clock pulse voltages which are supplied to the transfer electrodes covering the transfer channel of the charge coupled device.

At the beginning of an input cycle, the voltage connected to the oppositely doped region is reduced to a small value which results in flooding of the semiconductor region beneath the first gate and beneath the transfer gate adjacent to the first gate with charge carriers which are injected from the oppositely doped region. The voltage connected to the oppositely doped region is subsequently returned to its normal higher value so that the greater part of the charge carriers flow back into the oppositely doped region and only those charge carriers in the potential well resulting from the application of the clock pulse to the first transfer electrode remain beneath the electrode.

Upon the occurrence of a clock pulse connected to the next input stage transfer gate, a potential well is formed beneath that gate into which the charge packet previously beneath the first input stage transfer gate is transferred after the termination of the clock pulse attached to the first transfer gate electrode.

The potential well formed beneath the second input stage transfer gate electrode is not, however, large enough to accept all of the charge from the previously-formed well beneath the first input stage transfer electrode and the excess charge is transferred beneath the second gate electrode by the pulse voltage supplied thereto and subsequently into the transfer channel of the transfer device. This packet represents a positively evaluated first partial charge packet.

The remaining charge, which previously filled the potential well beneath the second input stage transfer gate is now transferred to beneath the transfer stage input gate and a successive clock pulse supplied to the second gate of the input stage transfers this charge into the transfer channel of the transfer device, thereby forming a second partial charge packet. The first and second partial charge packets formed in this manner are complimentary in that they supplement one another to form a constant charge amount. The first partial charge packet is made larger and the second partial charge packet is made correspondingly smaller with increased values of the input signal. The first partial charge packet thus positively evaluates the input signal whereas the second partial charge packet negatively evaluates the signal. The two charge packets are successively transferred in the same transfer channel of a single charge transfer device to an output stage. The transfer of the charge packets into the transfer channel in this manner is made possible by the fact that the clock pulse supplied to the second gate of the input stage operates at a frequency equal to that of the clock pulses supplied to the transfer electrodes covering the transfer channel.

In a second embodiment of the invention utilizing the same structure, the clock pulse voltage supplied to the second gate of the input stage has a frequency which is one half of the frequency of the clock pulses supplied to the transfer electrodes covering the transfer channel, and thus corresponds to the frequency of the clock pulse voltages supplied to the input stage transfer gates. In this embodiment, however, the lower voltage value of the clock pulse supplied to the second gate of the input stage must correspond to the minimum value of the input signal and the upper voltage value of the clock pulse cannot fall below the maximum value of the input signal. In this embodiment, the charge packet situated in the potential well beneath the second transfer gate of the input stage is transferred after termination of the pulse supplied to that electrode into the semiconductor region beneath the input gate electrode, the second gate of the input stage, and the first transfer electrode covering the transfer channel of the device. If the input signal happens to be at a maximum, the entire charge packet is contained in the potential well beneath the input gate. Upon the application of an input signal less than maximum, the charge packet is only partially accepted by the potential well beneath the electrode and the excess is transferred beneath the second gate of the input stage to the first transfer electrode covering the transfer channel upon the simultaneous occurrence of a clock pulse supplied to that transfer electrode. This represents the first partial charge packet with the amount of charge remaining beneath the input gate electrode representing the second partial charge packet. Only upon the occurrence of a subsequent clock pulse at one half the frequency of the clock pulse supplied to the transfer gates of the transfer channel does the second partial charge packet become transferred into the transfer channel. The first partial charge packet thereby represents an evaluation of the input signal sampled at the time of termination of the clock pulse supplied to the second transfer gate of the input stage which is undertaken negatively, whereas the second partial charge packet in this embodiment represents a positive evaluation of this signal value. By the time the second partial charge packet arrives beneath the first transfer electrode of the transfer channel, the first charge packet has already been shifted under successive transfer electrodes toward the output stage. The differential charge between the two charge packets represents a measure of the sampled value of the input signal.

The two successive charge packets transferred in the transfer channel may be evaluated by a difference-forming circuit, such as a differential amplifier, having its inputs connected to adjacent stages of the output stage for evaluating the difference between the two charge packets.

DESCRIPTION OF THE DRAWINGS

FIG. 2 is a voltage/time illustration for the various clock pulse voltages supplied to the circuit of FIG. 1a.

FIG. 3a is a sectional view of a second embodiment of the circuit of FIG. 1a.

SUMMARY OF THE INVENTION

Figure 1A:
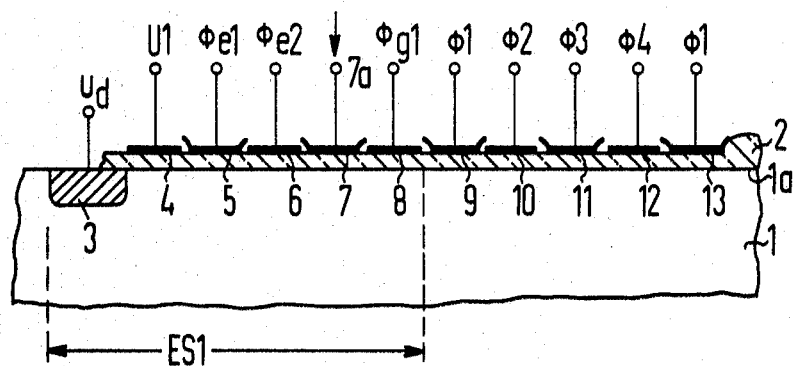
FIG. 1a is a sectional view of an input stage and a portion of the transfer channel of a charge coupled device constructed in accordance with the principles of the present invention.

An input stage and a portion of the transfer channel of a charge coupled device are shown in sectional view in FIG. 1a. The device is monolithically integrated on a semiconductor substrate 1 which may consist, for example, of p-doped silicon. The substrate 1 has a boundary surface 1a which is covered with a thin electrically insulating layer 2 which may, for example, consist of silicon dioxide and which in the embodiment shown is a gate oxide layer. An oppositely doped region 3 is situated at the boundary surface 1a which, in the example shown, is an n-conductive region. The region 3 may be generated by means of diffusion or ion implanation in a manner known to those skilled in the art. The oppositely doped region 3 has an electrode to which a voltage $u_d$ is supplied.

The region of the substrate 1 disposed adjacent to the oppositely doped region 3 is covered by a first input stage gate 4, two input stage transfer gate electrodes 5 and 6, an input gate 7 and a second input stage gate 8 which are all disposed on the insulating layer 2. The oppositely doped region 3 and the gates 4 through 8 comprise an input stage for a charge transfer device and are collectively designated as ES1. The first input stage gate 4 is supplied at a terminal with a constant voltage U1 and the input stage transfer gate electrodes 5 and 6 are respectively supplied at terminals with clock pulse voltages $\phi_{e1}$ and $\phi_{e2}$. An input signal indicated by the arrow is supplied to the input gate 7 at a terminal 7a and the second input stage gate 8 is supplied at a terminal with a clock pulse voltage $\phi_{g1}$.

A series of transfer electrodes 9, 10, 11, 12 and 13 are also disposed on the insulating layer 2 in sequence from gate 8 and are each connected to one of four phase-displaced clock voltages $\phi_1$, $\phi_2$, $\phi_3$ and $\phi_4$. The electrodes 9 through 12 characterize the first stage of a charge transfer device transfer channel following the input stage ES1. Further charge transfer device stages are connected in succession, of which only the first transfer electrode 13 of the second stage is illustrated in FIG. 1.

The operation of the input stage shown in FIG. 1a will be explained in conjunction with the potential diagrams shown in FIGS. 1b and 1c which represent the successive potential profile beneath the electrodes of the circuit of FIG. 1a during a charge packet-generating cycle. The various clock pulse voltages supplied to the terminals of the electrodes in FIG. 1a are represented graphically in FIG. 2 with respect to time.

Figure 1B:
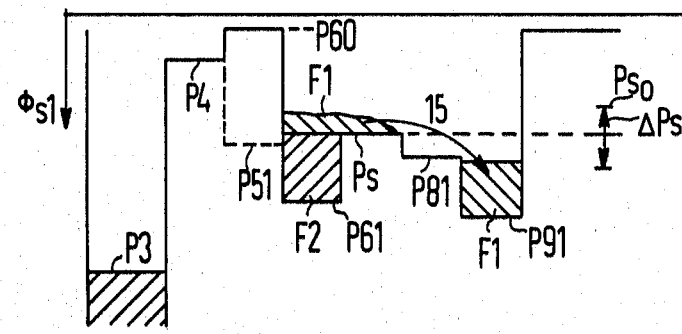
FIG. 1b is a graphic illustration of the potential beneath the various electrodes shown in FIG. 1a during generation of a first partial charge packet.
Figure 1C:
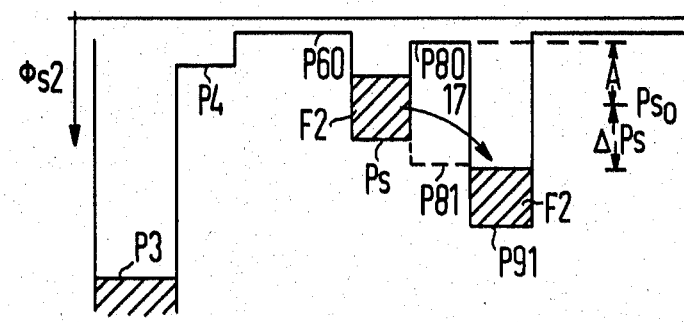
FIG. 1c is a graphic representation of the potentials beneath the electrodes shown in FIG. 1a during generation of a second partial charge packet.

FIG. 1b shows the potential $\phi_{s1}$ occurring at the boundary surface 1a for the generation of a first partial charge packet. The first partial charge packet is generated as follows. At a time t1, the voltage $u_d$ is reduced to a very small value which results in a flooding of the semiconductor region beneath the first input stage gate 4 and beneath the first input stage transfer gate 5 with charge carriers which are injected from the oppositely doped region 3. After the return of the voltage $u_d$ to its initial value $u_{do}$, which corresponds to the surface potential P3 shown in FIG. 1b, the greater part of the charge carriers flow back into the oppositely doped region 3. Only those charge carriers which are situated in the potential well P51 which were formed during the occurrence of a clock pulse $\phi_{e1}$ beneath the transfer electrode 5 and which fill up the potential well P51 to the edge potential threshold determined by the potential P4 remain in the well P51.

Before the occurrence of the next clock pulse $\phi_{e2}$, the well P51 is limited at the right by the potential P60 beneath the electrode 6. At a time t2, a clock pulse $\phi_{e2}$ is supplied to the transfer gate 6, so that a potential well P61 is formed beneath the transfer electrode 6 into which the charge packet previously situated in the well P51 is transferred after termination of the clock pulse $\phi_{e1}$. The surface potential occurring at the time t2 is shown by the solid line in FIG. 1b and is referenced at $\phi_{s1}$.

The charge packet transferred into the well P61 is only partially accepted by the well because the right boundary of the well P61 is determined by the potential $P_s$ formed beneath the input gate 7 as a function of the input signal $u_e$ supplied to the terminal at that time. A d.c. bias voltage is also supplied to the terminal 7a so that the d.c. voltage component of the input signal $u_e$ is set in such a manner that a potential boost $\Delta P_s$ results. The entire charge packet which is represented by the shaded areas F1 and F2 is an amount which will be accepted by the well P61 at the time of occurrence of the minimum signal voltage value which generates the surface potential referenced at $P_{s0}$. Upon the occurrence of an intermediate input signal value, however, which produces the potential $P_s$, the portion of the charge packet represented in the area F1 is transferred by the formation of the potential P81 beneath the second input stage gate 8 by the application of the clock pulse $\phi_{g1}$, into the well P91 which is formed beneath the electrode 9 as a result of the clock pulse $\phi 1$ supplied to the electrode 9. This transfer is indicated by the arrow 15. The portion of the charge packet represented by the area F1 thus represents a first partial charge packet which increases with an increasing input signal $u_e$. The input signal is therefore positively evaluated by the first partial charge packet.

At a time t3, a potential threshold P80 exists beneath the second input stage gate 8. The potential threshold P80 represents the right edge of a potential well $P_s$ which has a left edge determined by the potential P60 existing beneath the input stage transfer gate 6 after termination of the clock pulse $\phi_{e2}$. As shown in FIG. 1c, the course of the surface potential of the input stage ES1 at the time t3 is represented by the solid line and referenced at $\phi_{s2}$. At this time, the second partial charge packet, referenced at F2, is situated in the well $P_s$. It is presumed that at this time the potential value P80 lies below the value $P_{s0}$ by a predetermined amount A.

At a time t4, the potential threshold P80 is replaced by the potential value P81 upon the occurrence of the clock pulses 16 so that the second partial charge packet is transferred into the well P91 which is formed by the simultaneously occurring clock pulse $\phi 1$. This transfer is represented by the arrow 17. The first partial charge packet F1 and the second partial charge packet F2 are complementary inasmuch as they supplement one another to form a constant charge amount. The first partial charge packet F1 is larger and the second partial charge packet is smaller in amounts corresponding to the increase in the magnitude of the input signals $u_e$ occurring at the beginning of the clock pulse 14. The first partial charge packet F1 thus positively evaluates the input signal $u_e$, whereas the second partial charge packet F2 negatively evaluates the signal $u_e$.

By the application of the successive clock pulse voltages $\phi 1$ through $\phi 4$, the first partial charge packet has already been transferred beneath the transfer electrode 13 at the time when the second partial charge packet F2 is shifted under the transfer electrode 9. Thus, two partial charge packets F1 and F2, whose charge difference is a measure of the sampled value of $u_e$, are derived by the input stage ES1. The clock pulse voltages $u_d$, $\phi_{e1}$ and $\phi_{e2}$ operate at frequencies which are one half of the clock frequency of the voltages $\phi_{g1}$ and $\phi 1$ through $\phi 4$.

Figure 3A:
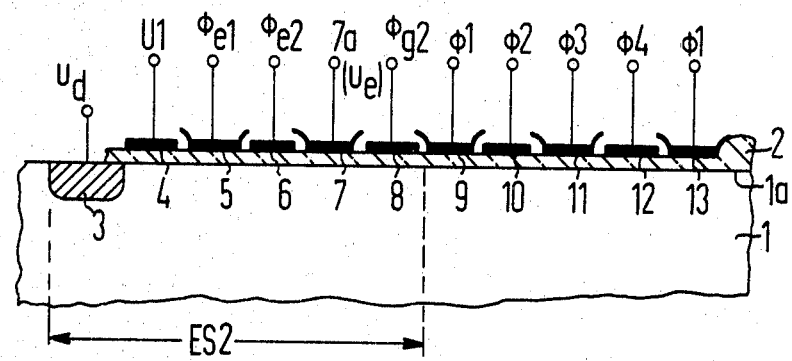

FIG. 3a shows a second embodiment of the input stage having a structure identical to the stage shown in FIG. 1a with the exception of a clock pulse voltage $\phi_{g2}$ being supplied to the second input stage gate 8 in place of the clock pulse voltage $\phi_{g1}$. The input stage shown in FIG. 3a is referenced at ES2, and all other components are referenced as in FIG. 1.

The frequency of the clock pulse signal $\phi_{g2}$ is one half of the frequency of the signal $\phi_{g1}$, and thus corresponds to the clock frequency of the voltages $u_d$, $\phi_{e1}$ and $\phi_{e2}$. Those voltages, as well as the other clock pulse voltages identified in connection with FIG. 1a are also supplied to the circuit shown in FIG. 3a as depicted in FIG. 2. As shown in FIG. 2, only one pulse 18 of the signal $\phi_{g2}$ is present in place of the three pulses 14, 16 and 19 of $\phi_{g1}$ during the same time period. The lower voltage value of $\phi_{g2}$ corresponds to the minimum value of the input signal $u_e$, whereas the upper voltage value of $\phi_{g2}$ must be below the maximum value of the input signal $u_e$.

Figure 3B:
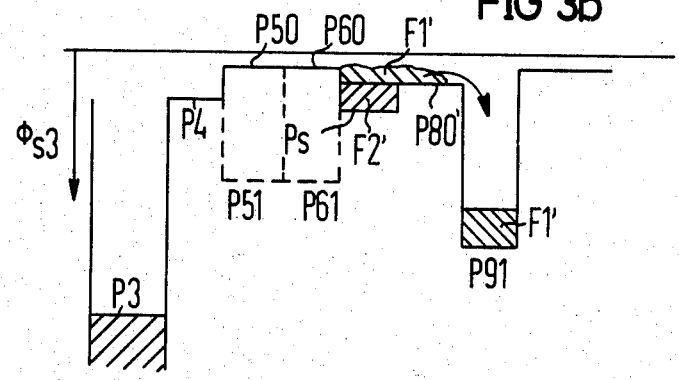
FIG. 3b is a graphic representation of the potentials beneath the various electrodes in the circuit of FIG. 3a for generating first and second partial charge packets.

The operation of the embodiment shown in FIG. 3a is as follows, with reference being made to the surface potential $\phi_{s3}$ which occurs during the operation of the circuit shown in FIG. 3a at a time t5 and is referenced with solid lines. The surface potential beneath the input stage transfer electrode 6 is referenced at P60, whereas the lower voltage value of $\phi_{g2}$ beneath the second input stage gate 8 generates a potential P80' which is identical to the potential $P_{s0}$. The charge packet situated in the well P61 during the occurrence of a clock pulse $\phi_{e2}$ is then transferred after termination of the clock pulse $\phi_{e2}$ into the semiconductor zone beneath the electrodes 7, 8 and 9. The entire charge packet is accepted by the potential well $P_s$ in the instance in which the maximum value of the input signal $u_e$ occurs at the terminal 7a and is supplied to the input electrode 7. For the situation illustrated in FIG. 3b, wherein an input signal between the maximum and minimum signal values is supplied to the input gate 7, the potential $P_s$ arises, generating a first charge packet shown by the shaded area referenced at F1' which is transferred across the threshold P80' into the potential well P91, which well is formed beneath the transfer electrode 9 by the simultaneous occurrence of a clock pulse $\phi_1$. A second charge packet, indicated by the shaded area referenced at F2', first remains in the potential well $P_s$ and upon the subsequent occurrence of the clock pulse 18 at a time t4, as shown in FIG. 2, the second partial charge packet F2' also is transferred into the recently-generated potential well P91. When the charge packet F2' arrives at the well P91, the first partial charge packet F1' has already been shifted beneath the transfer electrode 13 by the operation of the clock pulse voltages $\phi_1$ through $\phi_4$ supplied to the successive transfer gates.

The first partial charge packet F1'0 thereby evaluates the input signal $u_e$ sampled at the time of the termination of the clock pulse $\phi_{e2}$ in a negative manner, whereas the second partial charge packet F2' evaluates the same signal value in a positive manner. The differential charge between the partial charge packets F1' and F2' represents a measure for the sampled value of the input signal $u_e$ in the same manner as described in connection with FIG. 1.

Figure 4:
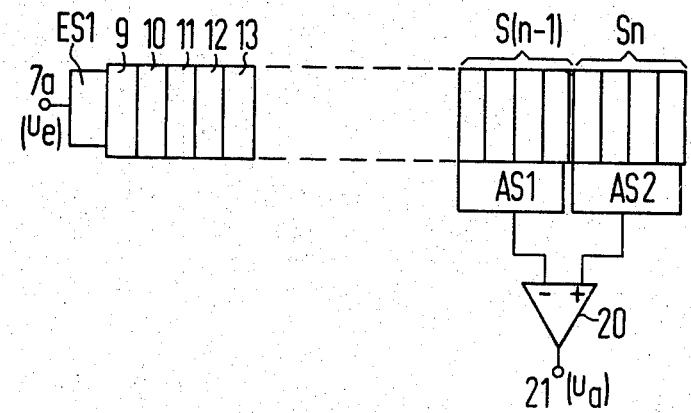
FIG. 4 is a schematic illustration of the use of the input stage shown in either FIG. 1a or FIG. 3a with a difference-forming output stage.

A charge transfer device arrangement making use of the inventive input stage disclosed herein is shown in FIG. 4. Although the input stage is referenced at ES1, it will be understood that the input stage ES2 shown in FIG. 3a may be utilized in this environment as well. The first transfer electrodes of the transfer channel of the device are referenced at 11 through 13 in accord with FIGS. 1a and 3a. The last two charge transfer device stages are respectively referenced at S(n−1) and Sn. These last stages are respectively coupled to output stages AS1 and AS2, which in turn are connected to the negative and positive inputs of a differential amplifier 20. At the output 21 of the differential amplifier 20, an output signal $u_a$ tapped. The stages S(n−1) and Sn respectively contain four transfer electrodes which are not illustrated in detail. The output stages AS1 and AS2 may be designed, for exampl, with diffusion regions or gate electrodes intermittently disconnected from external potentials with the diffusion regions or gate electrodes being connected to a transistor stage as is described, for example, in the text by Sequin and Tompsett "Charge Transfer Devices", identified above. Such output stages are designated as "floating diffusion outputs" and "floating gate outputs" and are described in greater detail in the article "Charge Coupled Devices-An Overview" identified above.

The stages AS1 and AS2 are operated with a clock frequency which corresponds to the clock pulse voltages $u_d$, $\phi_{e1}$ and $\phi_{e2}$, so that a first partial charge packet F1, supplied by the input stage ES1, is evaluated by the output stage AS2 and, simultaneously, the second partial charge packet F2 belonging to the same sampled value of $u_e$ is evaluated by the stage AS1. The differential signal $u_a$ which corresponds to the sampled signaled value $u_e$ is then formed in the differential amplifier 20 from the evaluation signals generated by the stages AS1 and AS2. If instead of the input stage ES1 the input stage ES2 shown in FIG. 3a is utilized, the inputs of the differential amplifier 20 must be interchanged.

By the use of such a charge transfer device arrangement with the inventive input stages disclosed herein, the influence on the charge packets of traps situated at the boundary surface 1a of the semiconductor substrate 1 is identical for both partial charge packets so that when the difference between the charge packets is taken this influence is of no consequence to the accuracy of the final output signal.

The above discussion has made use of charge transfer devices of the form known as a surface charge coupled device (SCCD). By this is meant a charge coupled device in which the charge packets are shifted at the surface of the semiconductor body 1. It will be understood, however, that other charge transfer device arrangements may be utilized without departing from the inventive concept disclosed herein such as the so-called "bucket brigade" devices (BCCD). In general, any arrangement may be employed which falls under the concept of a charge transfer device as explained in the text by Sequin and Tompsett identified above. Moreover, the operation of such devices may be undertaken in two-, three-, four- and multi-phase modes.

It will also be understood that if the input stage disclosed herein is integrated on an n-conductive silicon substrate 1, the region 3 may then be a p-conductive region and the positive clock pulse voltages shown in FIG. 2 may be replaced by corresponding negative clock pulse voltages.

Although other modifications and changes may be suggested by those skilled in the art, it is the intention of the inventor to embody within the patent warranted hereon all changes and modifications as reasonably and properly come within the scope of his contribution to the art.

I claim as my invention:

1. In an input stage for generating and supplying two complimentary charge packets to a charge transfer device monolithically integrated on a doped semiconductor body of one conductivity type having an opposite conductivity type (oppositely doped) region disposed in said input stage and covered at a boundary surface with an electrically insulating layer, said input stage having a first gate connected to a constant voltage and an input gate to which an input signal is supplied disposed on said insulating layer, said input stage further having at least two transfer gate electrodes disposed between said first gate and said input gate, and said charge transfer device having a plurality of transfer electrodes respectively connected to phase-displaced clock pulse voltages and disposed on said insulating layer above a transfer channel for said charge transfer device, the improvement of:
   a second gate in said input stage disposed between said input gate and said charge transfer device transfer electrodes,
   said oppositely doped region and said input stage transfer gate electrodes being connected to respective first clock pulse voltages having a clock frequency which is one half of the clock frequency of said phase-displaced clock voltages connected to said charge transfer device transfer gate electrodes.

2. The improvement of claim 1 wherein said second gate is connected to a clock pulse voltage having a clock frequency equal to the clock frequency of said phase-displaced clock voltages and alternating between an upper voltage value and a lower voltage value, said upper voltage value being higher than or equal to a maximum input signal voltage value and said lower voltage value being less than a minimum input signal voltage value by a preselected amount.

3. The improvement of claim 1 wherein said second gate is connected to a clock pulse voltage having a clock frequency equal to the clock frequency of said first clock pulse voltages and alternating between an upper voltage value and a lower voltage value, said upper voltage value being higher than or equal to a maximum input signal voltage value and said lower voltage value being equal to a minimum input signal voltage value.

4. The improvement of claim 1 wherein said complementary charge packets are successively transferred in said transfer channel and wherein said transfer channel has to successive transfer stages respectively connected to first and second output stages, said charge transfer device further having a differential amplifier having inputs respectively connected to said first and second output stages for forming a difference signal representing the charge difference between said complementary charge packets.

* * * * *